(12) United States Patent
Dinc et al.

(10) Patent No.: US 12,712,583 B2
(45) Date of Patent: Aug. 18, 2026

(54) TRANSMIT AND RECEIVE SWITCH WITH TRANSFORMER

(71) Applicant: TEXAS INSTRUMENTS INCORPORATED, Dallas, TX (US)

(72) Inventors: Tolga Dinc, Dallas, TX (US); Swaminathan Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 594 days.

(21) Appl. No.: 17/957,253

(22) Filed: Sep. 30, 2022

(65) Prior Publication Data

US 2024/0113739 A1 Apr. 4, 2024

(51) Int. Cl.

| | |
|---|---|
| ***H04W 48/18*** | (2009.01) |
| ***H03H 2/00*** | (2006.01) |
| ***H04B 1/00*** | (2006.01) |
| ***H04B 1/18*** | (2006.01) |
| *H01Q 23/00* | (2006.01) |

(52) U.S. Cl.

CPC .............. *H04B 1/18* (2013.01); *H03H 2/008* (2013.01); *H04B 1/0078* (2013.01); *H01Q 23/00* (2013.01)

(58) Field of Classification Search

CPC ........ H04B 1/18; H04B 1/0078; H03H 2/008; H03H 7/09; H03H 7/38; H01Q 23/00

USPC ........................................................ 455/552.1

See application file for complete search history.

(56) References Cited

U.S. PATENT DOCUMENTS

| | | | | |
|---|---|---|---|---|
| 8,749,156 | B2 * | 6/2014 | Cheng | H05B 41/28 315/210 |
| 10,804,809 | B1 * | 10/2020 | Yelaverthi | H02J 1/102 |
| 2010/0259319 | A1 * | 10/2010 | Chan | H03F 1/565 327/563 |
| 2017/0110974 | A1 * | 4/2017 | Chen | H02M 1/08 |
| 2020/0212813 | A1 * | 7/2020 | Chen | H02M 1/083 |
| 2022/0200576 | A1 * | 6/2022 | Zhan | H03H 7/0153 |

* cited by examiner

*Primary Examiner* — Tanmay K Shah

(74) *Attorney, Agent, or Firm* — Zhenhai Fu; Frank D. Cimino

(57) ABSTRACT

In examples, an electronic device includes an antenna and a transmitter line. The transmitter line includes a double-tuned transformer having first and second windings, the first winding having first and second ends, the second winding having third and fourth ends, and the third end coupled to the antenna. The transmitter line includes a first capacitor coupled between the first and second ends. The transmitter line also includes a second capacitor coupled between the third and fourth ends, and a switch coupled between the first end and a reference terminal.

26 Claims, 8 Drawing Sheets

800
802
OUTPUT POWER (dBm)
40.0
30.0
20.0
10.0
0.0
-10.0
-20.0
PIN (dBm)
-20.0
-15.0
-10.0
-5.0
0.0
5.0
10.0
15.0
20.0
25.0
30.0
35.0
40.0

TRANSMIT AND RECEIVE SWITCH WITH TRANSFORMER

BACKGROUND

Wireless devices include transmitter lines for transmitting data via an antenna and receiver lines for receiving data via the antenna. In some cases, the transmitter and receiver lines share an antenna. To facilitate sharing of an antenna, a switch may be coupled between the antenna, the transmitter line, and the receiver line. Responsive to the switch being in a transmit mode, the transmitter line is coupled to the antenna. Responsive to the switch being in a receive mode, the receiver line is coupled to the antenna.

SUMMARY

In examples, an electronic device includes an antenna and a transmitter line. The transmitter line includes a double-tuned transformer having first and second windings, the first winding having first and second ends, the second winding having third and fourth ends, and the third end coupled to the antenna. The transmitter line includes a first capacitor coupled between the first and second ends. The transmitter line also includes a second capacitor coupled between the third and fourth ends, and a switch coupled between the first end and a reference terminal.

DETAILED DESCRIPTION

Figure 1:
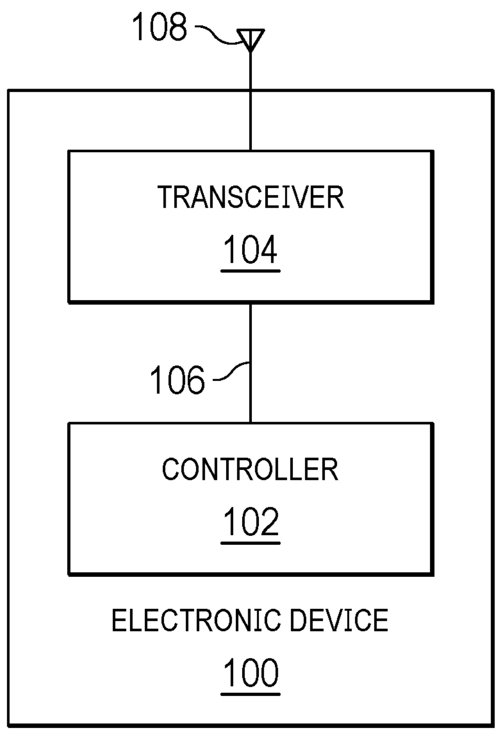
FIG. 1 is a block diagram of an electronic device including a transceiver with a transmit/receive (T/R) switch having a transformer for enhanced gain linearity and transmission efficiency, in accordance with various examples.

As described above, a wireless device may include an antenna that is shared between the transmitter and receiver lines of the wireless device. In some cases, a transmit/receive (T/R) switch is coupled between the antenna, the transmitter line, and the receiver line. Responsive to the switch being in a transmit mode, the antenna is coupled to the transmitter line, and responsive to the switch being in a receive mode, the antenna is coupled to the receiver line.

It is generally desirable for the transmitter line of a wireless device to transmit data as far as possible, taking into account the application for which the wireless device is intended and any constraints that may apply to the wireless device. To facilitate such extended transmission distance, the transmitter line should operate efficiently. For example, a transmitter line gain that exhibits poor linearity (as measured by the figure of merit P1 dB) produces diminishing returns as the power provided to the transmitter line is increased, and this represents an inefficiency that reduces the distance over which the transmitter line may transmit wireless signals. Similarly, other sources of inefficiencies, such as insertion losses, may reduce the distance over which the transmitter line transmits wireless signals. Because the transistors in the switch have poor performance (e.g., as measured by the figure of merit RonCoff, which can exceed 400 femto seconds), it is difficult for the transmit/receive switch to achieve low insertion losses (e.g., below 0.8 dB) and to achieve high gain linearity (e.g., above 37 dBm of P1 dB).

This description describes various examples of a wireless electronic device having transmitter and receiver lines configured to mitigate the inefficiencies described above, thereby enhancing transmission power relative to the transmission power that would otherwise be available to the device. In some examples, the electronic device includes a transmitter line having a transformer and first and second capacitors. The transformer has first and second windings, the first winding having first and second ends, and the second winding having third and fourth ends. The first capacitor is coupled between the first and second ends, the second capacitor is coupled between the third and fourth ends, and a first switch is coupled between the first and second ends. The antenna is coupled to the third end. The electronic device also includes a receiver line having second and third switches, the second switch coupled between the third end and the third switch, and the third switch coupled between the second switch and a ground terminal.

In a transmit mode, the second switch is opened and the third switch is closed, thereby uncoupling the receiver line from the antenna. Also during the transmit mode, the first switch is opened so there is no shunt to the ground terminal, and the transformer operates as a bandpass filter. In examples, the bandpass filter permits signals having the operating frequency of the transmitter line to pass to the antenna, and the bandpass filter blocks other signals. Further, the transformer may be double-tuned, meaning that circuitry external to the transformer, such as the first and second capacitors, may be tuned such that the first capacitor and the first winding resonate at the operating frequency of the transmitter line, and the second capacitor and the second winding also resonate at the operating frequency of the transmitter line. Such double-tuning represents another technique for enhancing transmission power by enhancing efficiency of the transmitter line.

In a receive mode, the second switch is closed and the third switch is open, thereby providing a low-impedance path from the antenna and through the receive line. Also during the receive mode, the first switch is closed, thereby providing a low-impedance (e.g., 5 ohms) shunt to the ground terminal, and the transformer operates as an impedance inverter. The impedance provided by the impedance inverter is seen from the perspective of the antenna, looking toward the transformer. The impedance provided by the impedance inverter is inversely proportional to the impedance provided by the first switch when closed. Because the first switch provides a low impedance if closed, the inverted impedance provided by the doubly-tuned transformer is high. Signals received by the antenna will flow through a low impedance receiver line rather than a high impedance transmitter line, particularly at or near the operating frequency of the electronic device.

By replacing some of the switching transistors of traditional wireless electronic devices with double-tuned transformers as described above and as described in greater detail below, the efficiency of the transmitter line is improved, both by improving insertion losses and by improving gain linearity. In this way, the challenges described above are mitigated.

FIG. 1 is a block diagram of an electronic device 100 providing enhanced gain linearity and transmission efficiency relative to other solutions, in accordance with various examples. The example electronic device 100 may include a controller 102, a transceiver 104, a connection 106, and an antenna 108. In examples, the controller 102 is a microcontroller, a processor, a microprocessor, an analog and/or digital control circuit, or any other type of circuitry configured to perform some or all of the actions attributed herein to the controller 102. Although not expressly shown, the controller 102 may include storage storing executable code, such as software and/or firmware. Responsive to execution by the controller 102, the executable code may cause the controller 102 to perform some or all of the actions attributed herein to the controller 102. In examples, the controller 102 is coupled to the transceiver 104 by way of the connection 106. The connection 106 may be a serial bus, a set of connections in parallel with each other, or any other suitable type of connection to provide signals from the controller 102 to the transceiver 104 for wireless transmission and/or wirelessly received signals from the transceiver 104 to the controller 102. The transceiver 104 may transmit signals via the antenna 108, and the transceiver 104 may receive wireless signals via the antenna 108. In examples, the electronic device 100 is battery-operated and has a finite amount of power to provide to the controller 102 and the transceiver 104 until recharge or replacement.

As described in greater detail below, the transceiver 104 includes a transmitter line and a receiver line, each of which is configured to process signals. More specifically, the transmitter line is configured to process signals in preparation for wireless transmission via the antenna 108. Conversely, the receiver line is configured to process signals wirelessly received via the antenna 108. The transceiver 104 includes a switch that enables the antenna 108 to be shared between the transmitter and receiver lines, such that during transmission, the switch couples the transmitter line to the antenna 108, and during reception, the switch couples the receiver line to the antenna 108. The switch includes a transformer to provide enhanced gain linearity and transmission efficiency, as described below.

Figure 2:
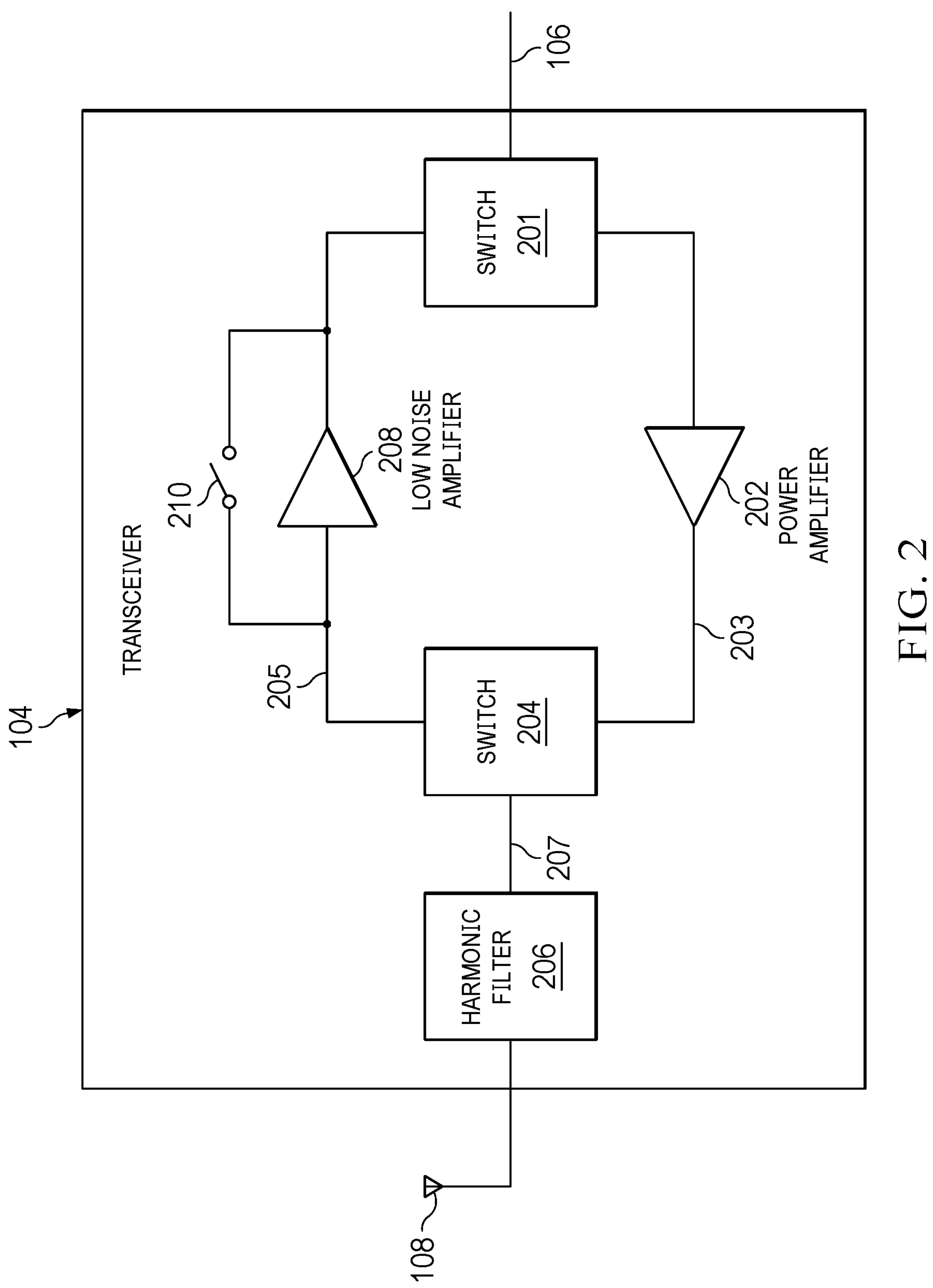
FIG. 2 is a circuit schematic diagram of a transceiver including a switch having a transformer for enhanced gain linearity and transmission efficiency, in accordance with various examples.

FIG. 2 is a circuit schematic diagram of the transceiver 104, in accordance with various examples. The transceiver 104 may include a switch 201, a power amplifier 202, a connection 203, a switch 204, a connection 205, a harmonic filter 206, a connection 207, a low noise amplifier 208, and a feedback switch 210. The connection 106 and an output of the low noise amplifier 208 are coupled to the switch 201. The switch 201 is coupled to an input of the power amplifier 202. An output of the power amplifier 202 is coupled to the switch 204 by way of the connection 203. The switch 204 is coupled to an input of the low noise amplifier 208 by way of the connection 205. The feedback switch 210 is coupled to the input and an output of the low noise amplifier 208. The output of the low noise amplifier 208 is coupled to the switch 201. The switch 204 is also coupled to the harmonic filter 206 by way of the connection 207. The harmonic filter 206 is also coupled to the antenna 108. The transceiver 104 may include circuitry other than that specifically shown in FIG. 2. A transmit line of the transceiver 104 includes the switch 201, the power amplifier 202, the switch 204, and the harmonic filter 206, along with any other circuitry coupled between these components. A receive line of the transceiver 104 includes the switch 201, the low noise amplifier 208, the feedback switch 210, the switch 204, and the harmonic filter 206, along with any other circuitry coupled between these components.

In operation, the transceiver 104 may be in a transmit mode or a receive mode. In the transmit mode, the transmitter line is engaged and the receiver line is disengaged, meaning that the transceiver 104 is provided signals via the connection 106 (e.g., from the controller 102 in FIG. 1) and transmits these signals via the antenna 108. In the transmit mode, the switch 201, which may include transistors, couples the connection 106 to the input of the power amplifier 202. Further, in the transmit mode, the switch 204 couples the connection 203 to the connection 207. Thus, in the transmit mode, the low noise amplifier 208 and the feedback switch 210 are inoperative in the transceiver 104. In the transmit mode, the power amplifier 202 receives a signal provided by the switch 201 from the connection 106, amplifies the signal, and provides the amplified signal to the switch 204, the operation of which is described below with reference to FIG. 3. The switch 204 provides the signal to the harmonic filter 206 via the connection 207, with the harmonic filter 206 mitigating harmonic voltage distortion in the signal. The harmonic filter 206 provides the filtered signal to the antenna 108 for transmission. In the receive mode, the receiver line is engaged and the transmitter line is disengaged, meaning that the transceiver 104 receives signals via the antenna 108 and provides these signals to the connection 106. In the receive mode, the harmonic filter filters the signal received by the antenna 108 and provides the signal to the switch 204. The switch 204 provides the signal to the low noise amplifier 208, which amplifies the signal without significantly increasing the signal-to-noise ratio, and provides the amplified signal to the switch 201. The switch 201 provides the signal to the connection 106. The switch 201 may be any suitable type of switch, such as an array of bipolar junction transistors (BJTs), field effect transistors (FETs), a throw switch, etc. The switch 204, however, has a configuration as described below with reference to the examples of FIGS. 3-6. In such examples, the switch 204 includes a transformer to provide enhanced gain linearity and transmission efficiency.

Figure 3:
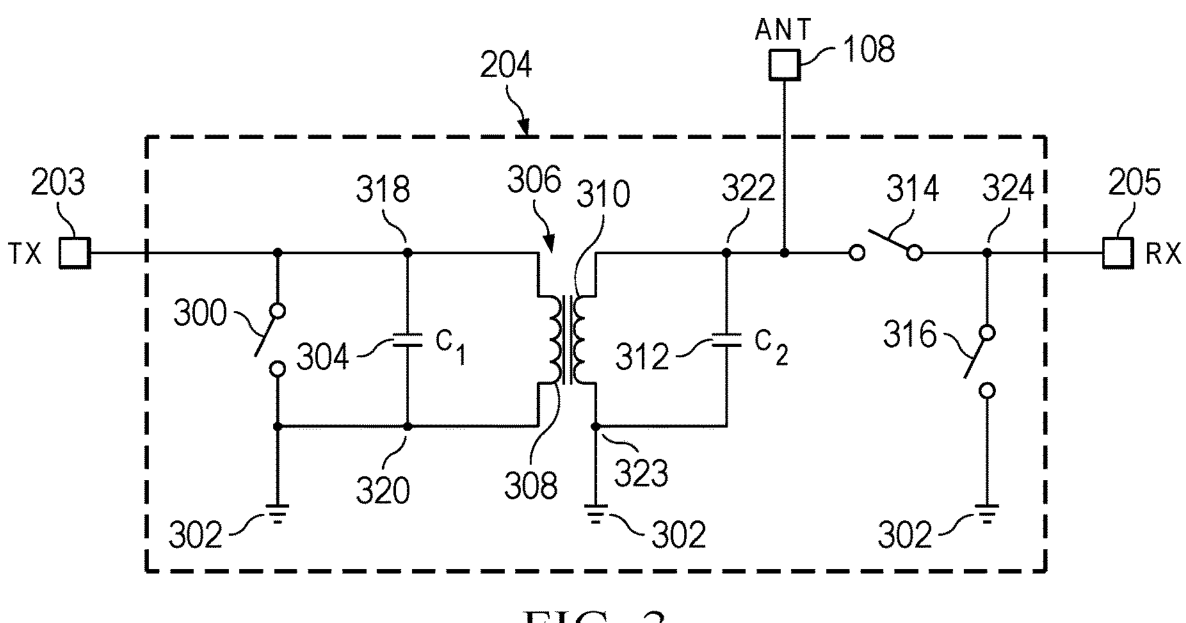
FIG. 3 is a circuit schematic diagram of a switch having a transformer for enhanced gain linearity and transmission efficiency, in accordance with various examples.

FIG. 3 is a circuit schematic diagram of the switch 204, in accordance with various examples. The example switch 204 includes a switch 300, a ground terminal 302 (which may be a reference terminal at a voltage other than ground but is assumed to be ground for the remainder of this description), a capacitor 304, a transformer 306 having a first winding 308 and a second winding 310, a capacitor 312, a switch 314, a switch 316, and ends 318, 320, 322, 323, and 324. More specifically, the switch 300 is coupled between the ground terminal 302 and the end 318. The capacitor 304 is coupled between the ends 318 and 320, with end 320 coupled to the ground terminal 302. The first winding 308 is coupled between the ends 318 and 320. The second winding 310 is coupled between the ends 322 and 323, with end 323 coupled to the ground terminal 302. The capacitor 312 is coupled between the ends 322 and 323. The switch 314 is coupled between the ends 322 and 324. The switch 316 is coupled between the end 324 and the ground terminal 302. Accordingly, the switch 300, the capacitor 304, and the first winding 308 are coupled in parallel. The second winding 310 and the capacitor 312 are coupled in parallel. Further, the end 318 is coupled to the connection 203 (FIG. 2), and the end 324 is coupled to the connection 205 (FIG. 2). The antenna 108 is coupled to the end 322. The switches 300, 314, and 316 may include arrays of transistors, such as BJTs or FETs, throw switches, or any other suitable types of switches. In some examples, the controller 102 (FIG. 1) may control the switches 300, 314, and 316. FIG. 3 does not expressly show the harmonic filter 206 of FIG. 2.

An example operation of the transceiver 104, and, particularly, the switch 204 is now described with simultaneous reference to FIGS. 2 and 3. In the transmit mode, signals are to be provided from the connection 106 to the antenna 108. In the transmit mode, the switch 204 is configured to provide signals from the connection 203 to the antenna 108. Accordingly, in the transmit mode, the switch 201 couples the connection 106 to the power amplifier 202, and the switch 204 engages the transmit path between the connection 203 and the antenna 108 while disengaging the receive path between the antenna 108 and the connection 205. Thus, signals reaching the end 322 are provided to the antenna 108 and not to the connection 205. Conversely, in the receive mode, signals are to be provided from the antenna 108 to the connection 106. In the receive mode, the switch 204 is configured to provide signals from the antenna 108 to the connection 205. Accordingly, in the receive mode, the switch 201 couples the output of the low noise amplifier 208 to the connection 106, and the switch 204 engages the receive path between the antenna 108 and the connection 205 while disengaging the transmit path between the connection 203 and the antenna 108. Thus, signals received by the antenna 108 are provided to the connection 205 rather than the connection 203. The operation of each of the transmit and receive modes is now described in turn with continued reference to FIGS. 2 and 3.

In the transmit mode, the controller 102 (FIG. 1) causes switch 300 to open, switch 314 to open, and switch 316 to close. An open switch 300 prevents a signal provided on connection 203 from being shunted to ground via the switch 300 and the ground terminal 302. Instead, the signal provided on connection 203 proceeds toward the antenna 108. Also during the transmit mode, the switch 314 being open prevents the signal flowing from the connection 203 toward the antenna 108 from flowing toward the connection 205. Instead, the signal to be transmitted flows from the connection 203 to the antenna 108. The switch 316 being closed shunts the connection 205 to ground via the ground terminal 302, thus mitigating any effect of the connection 205 and signals on the connection 205 from affecting the signal being transmitted via the antenna 108. In the transmit mode, the transformer 306 operates as a bandpass filter. For example, the frequency band of the bandpass filter may be controlled by manipulating the capacitance values of the capacitors 304 and 312, the inductance values of the first and second windings 308 and 310, and the coupling coefficient k of the transformer 306. In examples, the frequency band of the bandpass filter is selected to match the operating frequency of the transformer 306. When determining capacitance values of the capacitors 304 and 312 to control the frequency band of the bandpass filter of the transformer 306, parasitic capacitances added to the capacitance of the capacitor 304 by the switch 300 should be considered, and similarly, parasitic capacitances added to the capacitance of the capacitor 312 by the switch 314 should be considered. In examples, the transformer 306 includes high-quality (high Q-factor) windings 308 and 310, with the Q factor ranging from 50 to 100. The Q factor is to be maintained in this range to keep receive mode losses below 0.8 dB, and to achieve a higher impedance scaling factor K so the impedance of the switch 300 when closed is transformed to a high impedance at the end 322 (the impedance inversion described herein).

The capacitors 304 and 312, in conjunction with the first and second windings 308 and 310, respectively, enable signals on either side of the transformer 306 to resonate. The resonance frequency on each side of the transformer 306 is controllable by adjusting the capacitances of the capacitors 304 and 312. For example, adjusting the capacitance of the capacitor 304 adjusts the resonance frequency on the left side of the transformer 306. Similarly, adjusting the capacitance of the capacitor 312 adjusts the resonance frequency on the right side of the transformer 306. By adjusting the resonance frequencies on both sides of the transformer 306 to be equivalent to the operating frequency of the transformer 306, the transformer 306 is said to be a double-tuned transformer. Because the switches 300 and 314 affect the capacitances of the capacitors 304 and 312, the switches 300 and 314 also affect the resonance frequencies described above, and thus the switches 300 and 314 (e.g., transistors in the switches 300 and 314) may be selected (e.g., transistor type, number, size, and/or configuration) to control the resonance frequencies (e.g., to double tune the transformer 306).

In the receive mode, the controller 102 (FIG. 1) controls the switches 300, 314, and 316 to be closed, closed, and open, respectively. If the switch 314 is closed, signals received via the antenna 108 are provided with a low impedance path to the connection 205. Further, by controlling the switch 316 to be open, the signal flowing from the antenna 108 to the connection 205 via the switch 314 is not shunted to ground via the ground terminal 302. The closed switch 300 provides a low, but not zero, impedance path to ground between the connection 203 and the ground terminal 302. In the receive mode, the transformer 306 operates as an impedance inverter. More specifically, in the receive mode, the transformer 306 provides an impedance to the antenna 108 (looking toward the transformer 306) that is an inverted form of the impedance present on the end 318. Yet more specifically, the transformer 306 provides to the antenna 108 (looking toward the transformer 306) an impedance that is equivalent to $K^2/R_{ON}$, where K is the impedance scaling factor (which is a function of the inductances of windings 308 and 310, the capacitances of capacitors 304 and 312, and the coupling coefficient k of the transformer 306), and Rory is the impedance on the end 318. As described above, the impedance on the end 318 is low (e.g., 5 ohms) because the closed switch 300 provides a shunt to ground via the ground terminal 302. Thus, when this low impedance value $R_{ON}$ is included in the denominator of the impedance $K^2/R_{ON}$ provided to the antenna 108 (looking toward the transformer 306), the inverted impedance $K^2/R_{ON}$ becomes large. In this way, the transformer 306 provides a high impedance to the antenna 108, looking toward the transformer 306. If the antenna 108 receives a signal, the signal may travel toward the transformer 306, which presents a high impedance, or the signal may travel toward the connection 205 via the switch 314, which is a low impedance path. The signal will flow toward the connection 205 along the low impedance path. Thus, little or none of the received signal is lost to the transformer 306 side of the switch 204.

A double-tuned transformer 306 that increases signal strength through parallel resonance and that mitigates signal losses as described above improves efficiency, battery life, and wireless communication range. Efficiency improvements also operate to increase the gain linearity figure of merit P1 dB, which indicates increased power output at higher power input levels. In examples, the transformer 306 operates as an impedance matching network between the power amplifier 202 and the antenna 108. An impedance matching network matches impedances between the power amplifier 202 and the antenna 108, thus mitigating the amount and/or effect of reflected and/or standing signals that would otherwise be present due to sharp impedance gradients. A lessened impact of reflected and/or standing signals improves efficiency, as a greater amount of the signal output by the power amplifier 202 reaches the antenna 108 for transmission, thereby further improving signal strength, efficiency (e.g., insertion losses), and relevant figures of merit for gain linearity, such as P1db.

The impedance-matching ability of the transformer 306 may be controlled by adjusting one or more of: the turns ratio between the windings 308 and 310 of the transformer 306; the inductances of the windings 308 and 310 of the transformer 306; impedances associated with the windings 308 and 310; the frequency of operation; and the configuration of the windings 308 and 310. Other features may contribute to the impedance matching ability of the transformer 306, and such features may also be adjusted to adjust the impedance provided by the transformer 306.

Figure 4:
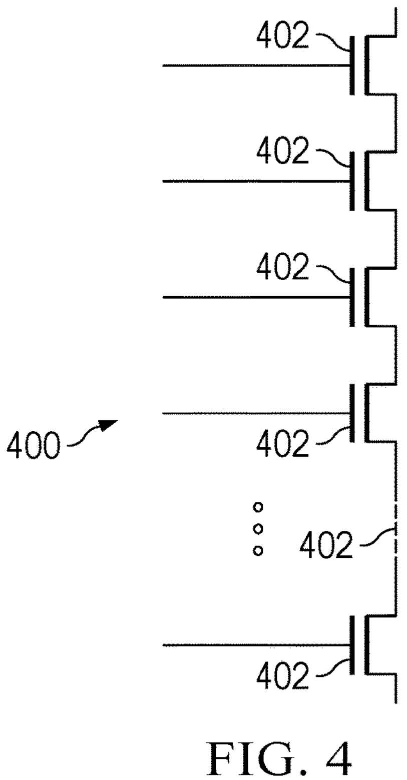
FIG. 4 is a circuit schematic diagram of a switch having transistors coupled together, in accordance with various examples.

FIG. 4 is a circuit schematic diagram of a switch 400 having transistors 402 coupled together, in accordance with various examples. The example switch 400 is representative of the switch 300, 314, and/or 316 (FIG. 3). For instance, a top end of the switch 400 may be coupled to the end 318, and a bottom end of the switch 400 may be coupled to the ground terminal 302. For instance, the top end of the switch 400 may be coupled to the end 322, and the bottom end of the switch 400 may be coupled to the end 324. For instance, the top end of the switch 400 may be coupled to the end 324, and the bottom end of the switch 400 may be coupled to the ground terminal 302. The switch 400 may include any type of transistor, such as BJTs, FETs, etc. The transistors 402 in the switch 400 are sized as may be suitable. The transistors 402 in the switch 400 may be coupled in a series configuration, with non-gate terminals of the transistors 402 coupled in series as shown (e.g., a drain of a first transistor 402 coupled to a source of a second transistor 402, or vice versa). The switch 400 may include any number of transistors. Control terminals (e.g., gates) of the transistors 402 may be coupled to the controller 102 (FIG. 1), thereby enabling the controller 102 to control operation of the switch 204. Transistors 402 are useful in the switch 400 at least because they enabling the application of large voltages across the switch 400. This is because a series of transistors 402 operates as a capacitor ladder, with the voltage drop across each transistor 402 becoming smaller for a given voltage across the switch 400 as the number of transistors 402 increases.

Figure 5:
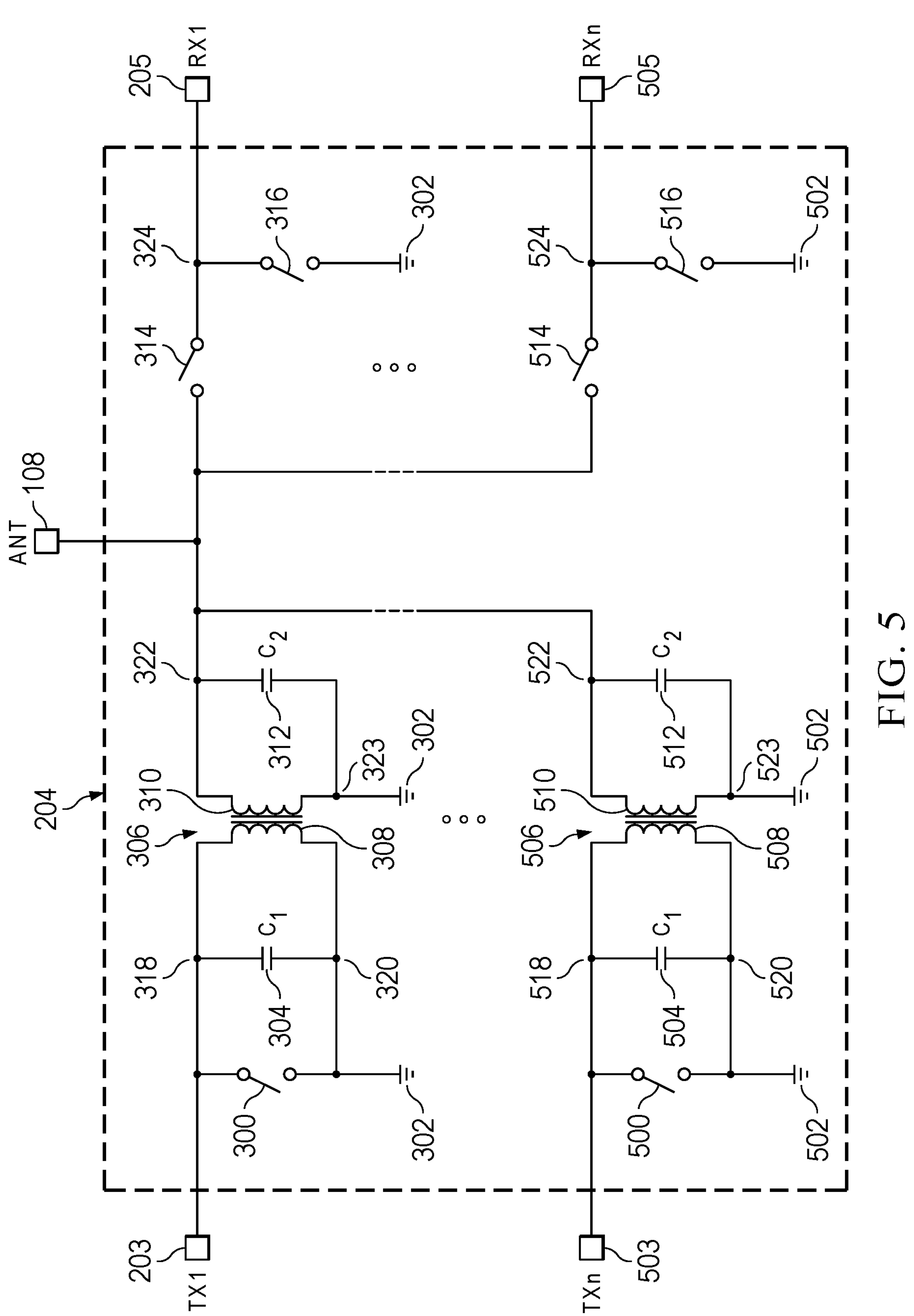
FIG. 5 is a circuit schematic diagram of a switch having a transformer for enhanced gain linearity and transmission efficiency, in accordance with various examples.

FIG. 5 is a circuit schematic diagram of another example of the switch 204. The switch 204 of FIG. 5 is identical to that of FIG. 3, except that the switch 204 of FIG. 5 includes multiple instances of the circuit components of FIG. 3. For example, the switch 204 of FIG. 5 includes the switch 300, the ground terminals 302, the capacitor 304, the transformer 306, the capacitor 312, the switch 314, and the switch 316. The switch 204 also includes a switch 500, ground terminals 502, a capacitor 504, a transformer 506 having first winding 508 and second winding 510 (and having the same features as transformer 306, described above), a capacitor 512, a switch 514, and a switch 516, the connections between which are the same as those for like numerals in FIG. 3. The capacitances of the capacitors 504 and 512 may be selected as described above for the capacitances of the capacitors 304 and 312. An end 522 is coupled to the end 322, and the switch 514 is coupled to the switch 314 and the antenna 108, as shown. The end 522 is coupled to a connection 503, and an end 524 is coupled a connection 505. The connections 203 and 503 are coupled to differing transmitter lines, and the connections 205 and 505 are coupled to differing receiver lines. Additional circuitry similar to that shown in FIGS. 3 and 5 may be included. The controller 102 (FIG. 1) operates the switches in the switch 204. More specifically, in a transmit mode, assuming the connection 205 provides a signal to be transmitted, the switch 300 is open, the switch 314 is open, and the switch 316 is closed, as described above with reference to FIG. 3. Further, in the transmit mode where the connection 205 provides a signal to be transmitted, the switch 500 is closed, thereby causing the transformer 506 to operate as an impedance inverter and preventing the signal at the end 322 from flowing toward the transformer 506. The switches 514 and 516 are open and closed, respectively, to prevent the signal at the end 322 from flowing toward the connection 505. Similarly, in a transmit mode in which the connection 505 provides a signal to be transmitted, the switch 300 is closed, causing the transformer 306 to operate as an impedance inverter to prevent the signal from flowing toward the connection 205. The switch 500 is open. The switches 314 and 514 are open and the switches 316 and 516 are closed, preventing the signal from flowing toward the connections 205 and 505.

Still referring to FIG. 5, in a receive mode, assuming the connection 205 is to receive a signal from the antenna 108, the switches 300 and 500 are closed, causing the transformers 306 and 506 to operate as impedance inverters so the received signal does not flow toward either of the connections 203 and 503. Further, the switches 514 and 516 are open and closed, respectively, thus preventing the received signal from flowing toward the connection 505. The switch 314 is closed and the switch 316 is open, facilitating signal flow from the antenna 108 to the connection 205. In a receive mode, assuming the connection 505 is to receive a signal from the antenna 108, the switches 300 and 500 are closed, causing the transformers 306 and 506 to operate as impedance inverters so the received signal does no flow toward either of the connections 203 and 503. Further, the switches 314 and 316 are open and closed, respectively, thus preventing the received signal from flowing toward the connection 205. The switch 514 is closed and the switch 516 is open, facilitating signal flow from the antenna 108 to the connection 505.

Figure 6:
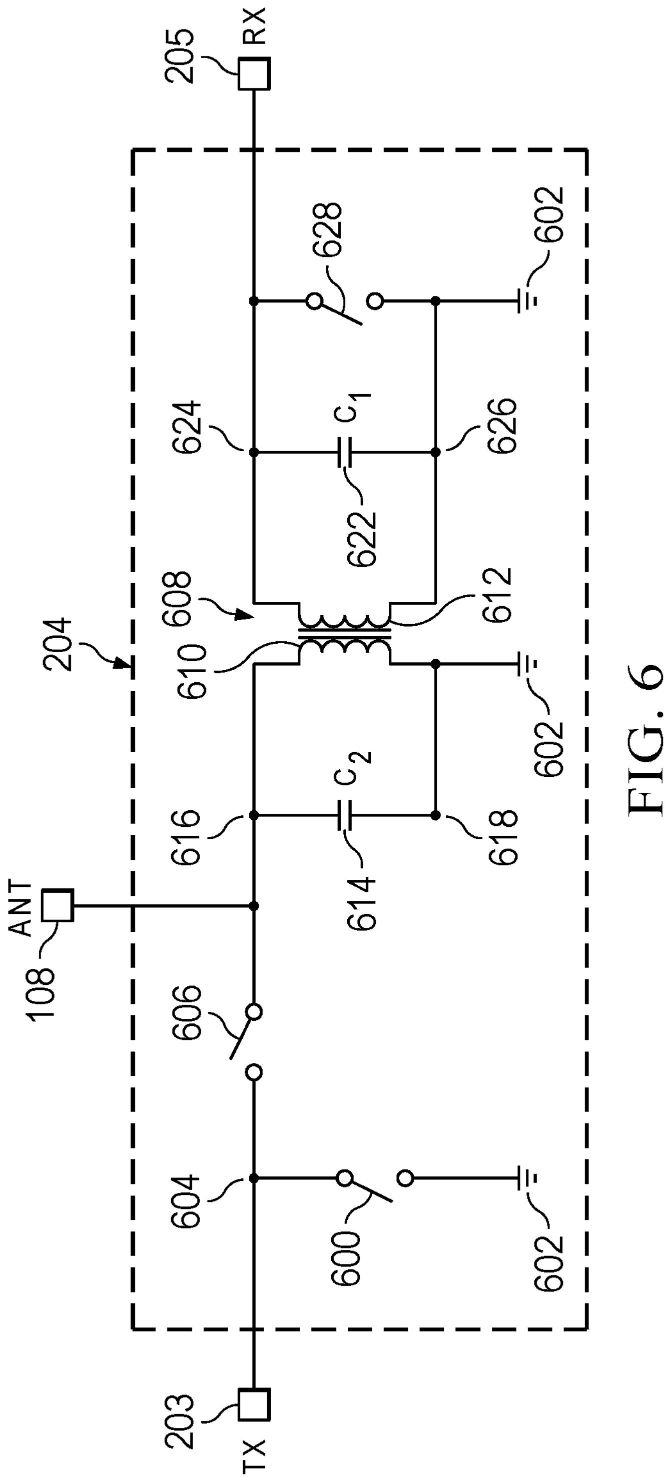
FIG. 6 is a circuit schematic diagram of a switch having a transformer for enhanced gain linearity and transmission efficiency, in accordance with various examples.

FIG. 6 is a circuit schematic diagram of a switch 204 having a transformer for enhanced gain linearity and transmission efficiency, in accordance with various examples. The switch 204 of FIG. 6 includes a switch 600, a ground terminal 602, an end 604 of the switch 600, a switch 606, a transformer 608 having first winding 610 and second winding 612 (and having the same features as transformer 306, described above), a capacitor 614 having ends 616 and 618, a capacitor 622 having ends 624 and 626, and a switch 628. The switch 600 is coupled between the end 604 and ground terminal 602. The switch 606 is coupled between the end 604 and the end 616. The antenna 108 is coupled between the end 605 and the end 616. The end 604 is coupled to connection 203. The first winding 610 is coupled between the ends 616 and 618. The end 618 is coupled to ground terminal 602. The second winding 612 is coupled between ends 624 and 626. The switch 628 is coupled between the ends 624 and 626. The end 626 is coupled to ground terminal 602. The end 624 is coupled to the connection 205. The controller 102 (FIG. 1) controls the switches 600, 606, and 628.

In a transmit mode, the switch 600 is open, the switch 606 is closed, and the switch 628 is closed. The switches 600 and 606 being open and closed, respectively, presents a low impedance path for signals to flow from the connection 203 to the antenna 108. Minimal signal leakage is present through the transformer 608 because the transformer 608 operates as an impedance inverter if the switch 628 is closed. In a receive mode, the switch 600 is closed, the switch 606 is open, and the switch 628 is open. The switches 600 and 606 being closed and open, respectively, prevents signal flow from the antenna 108 to the connection 203. The transformer 608 operates as a bandpass filter, as described above, and signals having frequencies falling within the frequency band of the bandpass filter are provided from the antenna 108 to the connection 205. The features of the transformer 608 and the capacitors 614 and 622 may be similar or identical to those described above for transformer 306 and capacitors 304 and 312.

Figure 7:
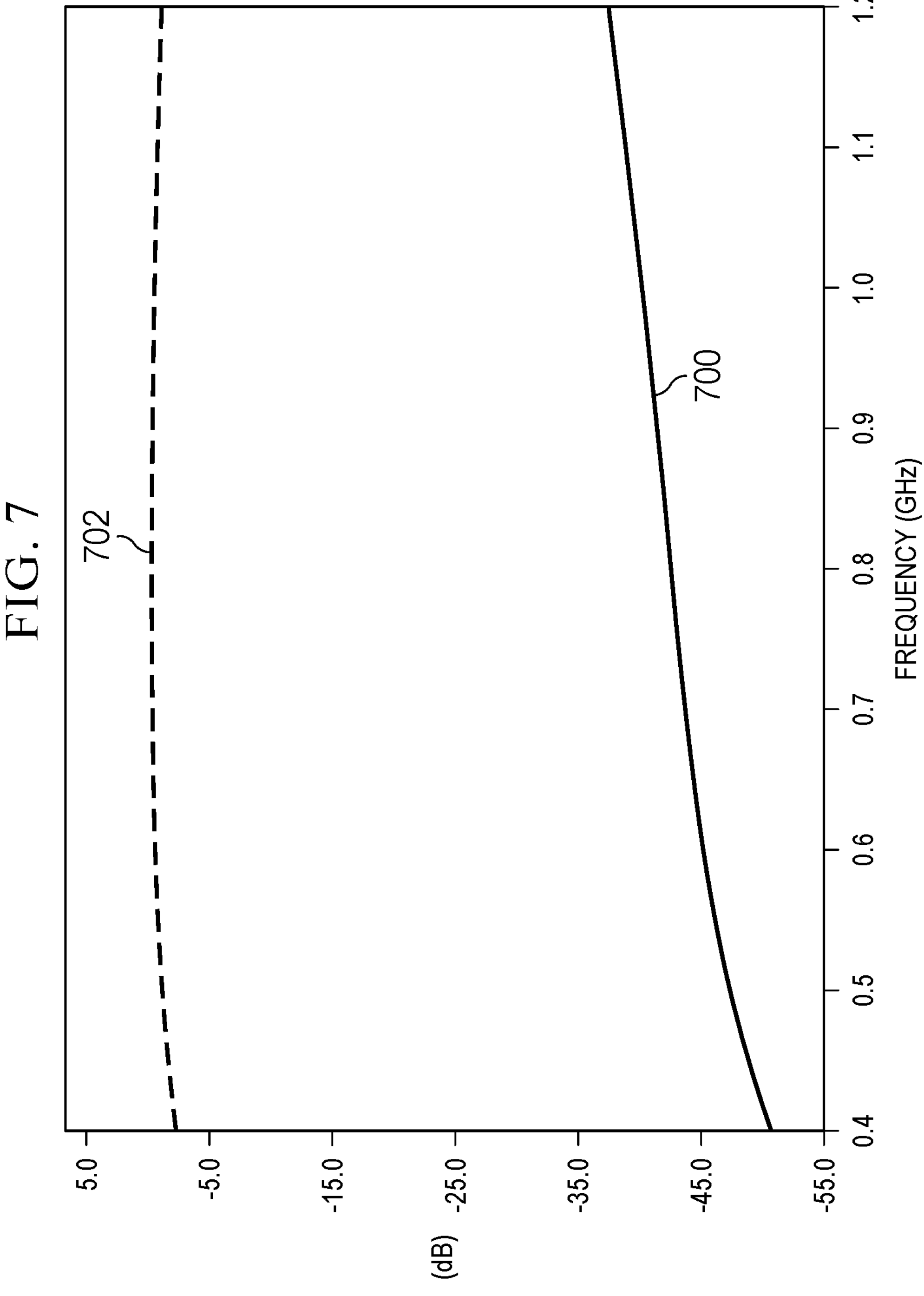
FIG. 7 is a graph showing the performance of a switch having a transformer for enhanced gain linearity and transmission efficiency, in accordance with various examples.

FIG. 7 is a graph showing performance of a switch (e.g., switch 204) having a transformer for enhanced gain linearity and transmission efficiency, in accordance with various examples. The x-axis shows operating frequency in GHz, and the y-axis shows insertion losses and isolation in dB. Curve 702 shows insertion losses in the switch 204, which are low across a large operating frequency range. Curve 704 shows strong isolation between the transmitter and receiver lines of the transceiver 104 across a large operating frequency range.

Figure 8:
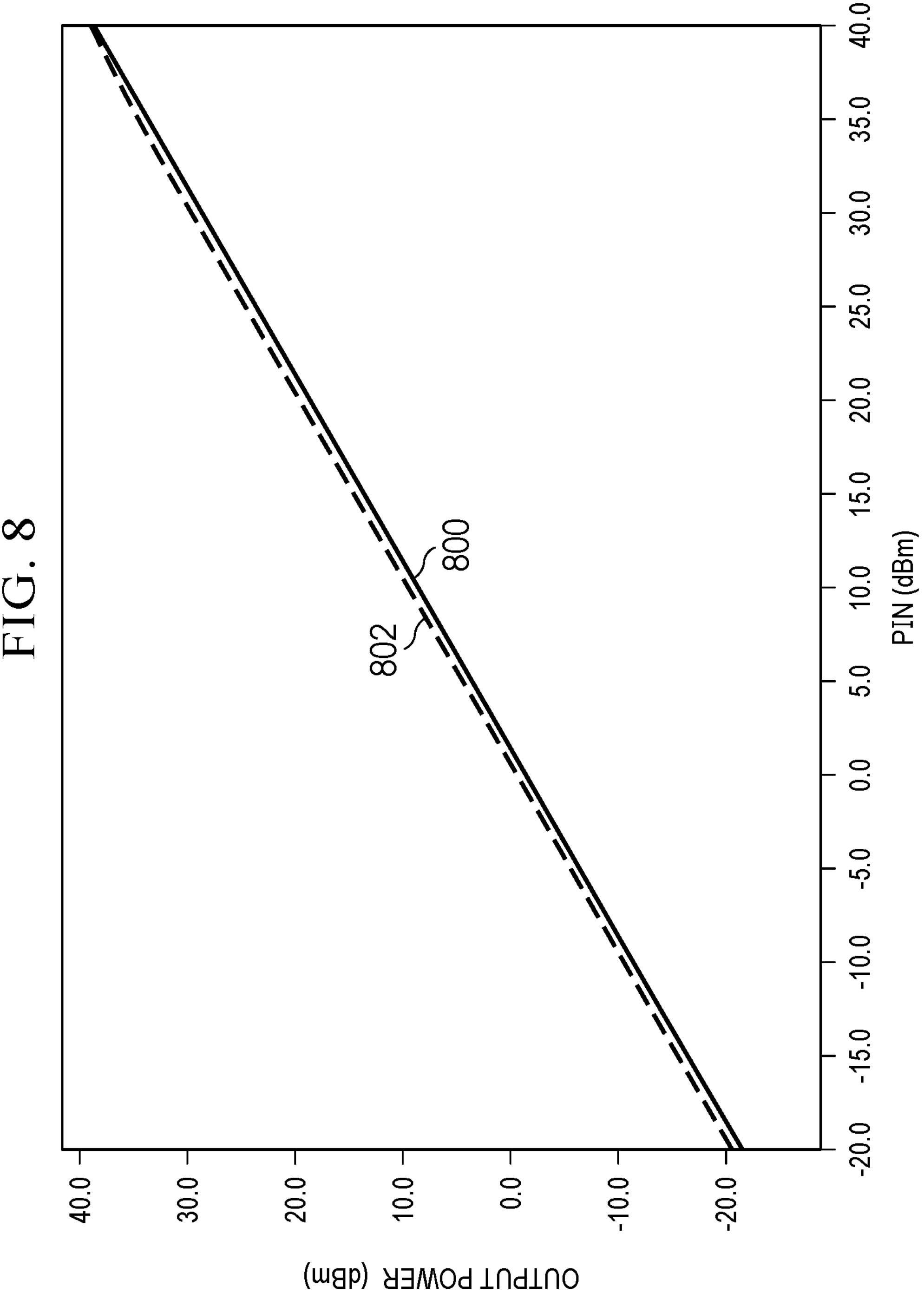
FIG. 8 is a graph showing the performance of a transceiver having a transformer for enhanced gain linearity and transmission efficiency, in accordance with various examples.

FIG. 8 is a graph showing performance of a transceiver having a transformer for enhanced gain linearity and transmission efficiency, in accordance with various examples. The x-axis indicates power provided to the transmitter line of the transceiver 104 (FIGS. 1 and 2) in dBm, and the y-axis indicates output power provided by the antenna 108 (FIGS. 1 and 2) in dBm. The curve 800 is a reference line for 1 dB compression, and the curve 802 shows output power vs. input power. The intersection point is the 1 dB compression point. The graph of FIG. 7 demonstrates that the structures described herein achieve an insertion loss of less than 0.6 dB in the sub-1 GHz range, and the graph of FIG. 8 demonstrates that the structures described herein achieve an input referred P1dB of 37.6 dBm, both of which significantly promote high efficiency and long-range wireless transmission.

Figure 9:
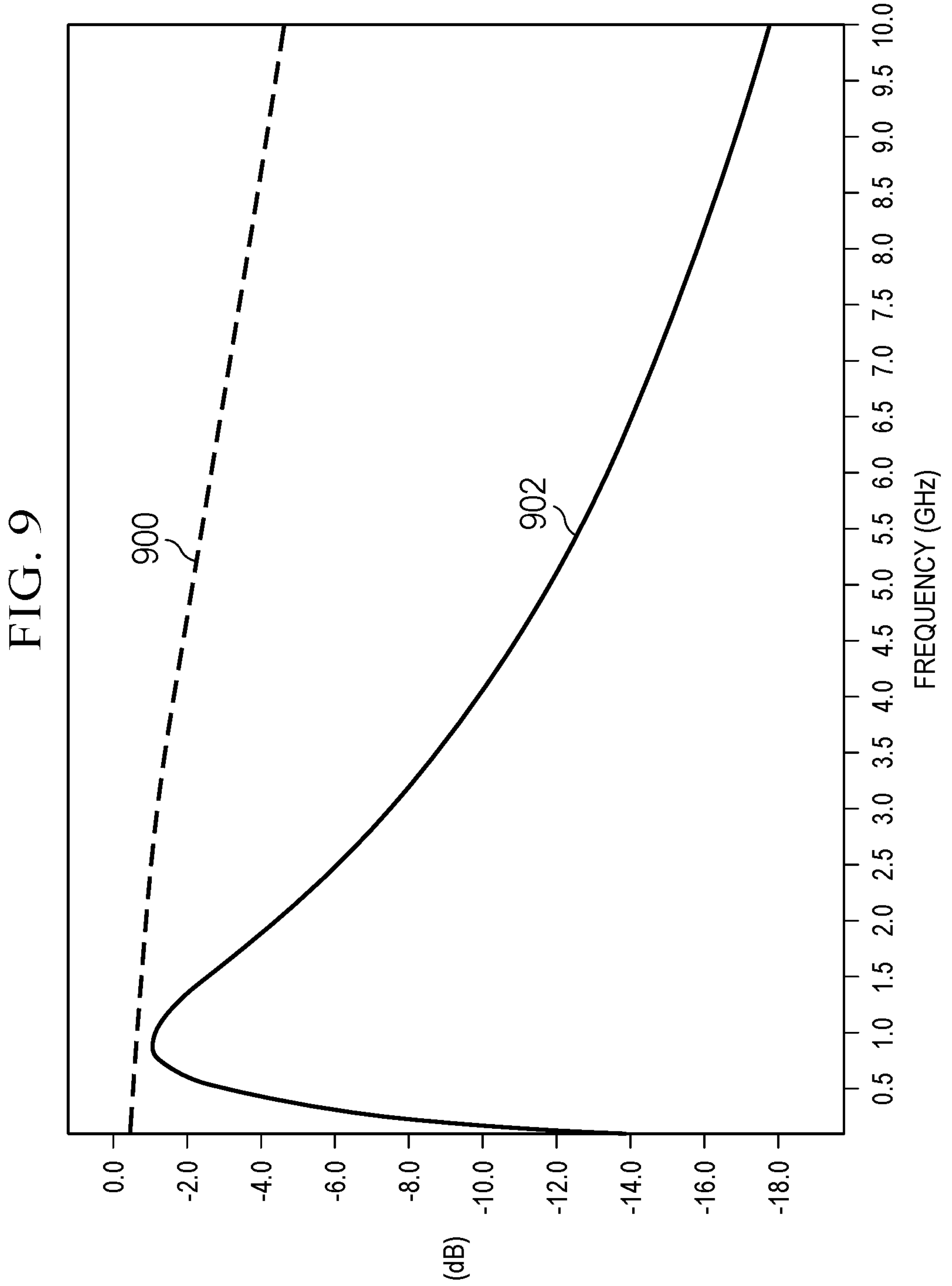
FIG. 9 is a graph showing the performance of a switch having a transformer for enhanced gain linearity and transmission efficiency, in accordance with various examples.

FIG. 9 is a graph showing performance of a switch having a transformer for enhanced gain linearity and transmission efficiency, in accordance with various examples. The x-axis shows operating frequency in GHz, and the y-axis shows insertion loss in dB in a receive mode. The curve 900 shows insertion losses if the transformer 306, the capacitors 304 and 312, and the switch 300 were disconnected from the antenna 108. Because none of the received signal could leak into disconnected circuitry, losses are low across a range of operating frequencies. The curve 902 shows insertion losses of the structures described herein in a receive mode. At approximately 1.2 GHz, which is the resonant frequency of the circuit, impedance provided by the above-described impedance inverter is highest, and thus insertion losses are at their lowest. At other frequencies, the impedance provided by the impedance inverter is lower, and thus insertion losses are greater. Nevertheless, the performance of the structures described herein to mitigate insertion losses at the resonant frequency is nearly identical to the ideal as represented by curve 900.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Instances of the term "ground" or variants thereof in the foregoing description may include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An electronic device, comprising:
a first winding having first and second ends and coupled to a first terminal;
a second winding having third and fourth ends and coupled to a second terminal;
a first capacitor coupled between the first and second ends;
a second capacitor coupled between the fourth and third ends; and
a switch, wherein the switch and the first capacitor are coupled in parallel between the first and second ends, and the switch is configurable to shunt at least the first capacitor.

2. The electronic device of claim 1, wherein, in a first mode, the first and second windings are configurable as an impedance inverter and the switch is closed.

3. The electronic device of claim 2, wherein the impedance inverter is configurable to provide an impedance based on an impedance of the closed switch.

4. The electronic device of claim 1, wherein, in a second mode, the first and second windings are configurable as a bandpass filter.

5. The electronic device of claim 4, wherein a frequency band of the bandpass filter is based on capacitances of the first and second capacitors, inductances of the first and second windings, and a coupling coefficient between the first and second windings.

6. The electronic device of claim 1, wherein the switch is a first switch, and the electronic device further comprises a second switch coupled between the third and fourth ends, and a third switch coupled between the third or fourth end and a third terminal.

7. The electronic device of claim 6, wherein, in a first mode, the third switch is closed and the second switch is open.

8. The electronic device of claim 7, wherein, in a second mode, the third switch is open and the second switch is closed.

9. The electronic device of claim 1, wherein the first and second windings are configurable to resonate at a frequency based on capacitances of the first and second capacitors.

10. The electronic device of claim 1, wherein the switch includes multiple transistors coupled in a series configuration.

11. The electronic device of claim 1, further comprising a power amplifier coupled to the first terminal and an antenna coupled to the second terminal.

12. An electronic device, comprising:
a first winding having first and second ends and coupled to a first terminal;
a second winding having third and fourth ends and coupled to a second terminal;
a first capacitor coupled between the first and second ends;
a second capacitor coupled between the fourth and third ends; and
a switch coupled between the first and second ends, the switch configurable to open in a transmit mode and close in a receive mode.

13. The electronic device of claim 12, wherein the switch is a first switch, and the electronic device further comprises:
a second switch coupled between the third and fourth ends; and
a third switch coupled between the third or fourth end and a third terminal.

14. The electronic device of claim 13, wherein, in the receive mode, the third switch is closed and the second switch is open.

15. The electronic device of claim 13, wherein, in the transmit mode, the third switch is open and the second switch is closed.

16. The electronic device of claim 12, wherein the first and second windings are configurable to resonate at a frequency based on capacitances of the first and second capacitors.

17. An electronic device, comprising:
a first winding having first and second ends and coupled to a first terminal;
a second winding having third and fourth ends and coupled to an antenna terminal;
a first capacitor coupled between the first and second ends;
a second capacitor coupled between the fourth and third ends;
a first switch coupled between the first and second ends;
a second switch coupled between the third and fourth ends; and
a third switch coupled between a second terminal and the third or fourth end.

18. The electronic device of claim 17, further comprising a transmit circuit and a receive circuit, the transmit circuit coupled to one of the first or second terminals, and the receive circuit coupled to the other one of the first or second terminals.

19. The electronic device of claim 17, wherein, in a transmit mode, the first switch is open, the second switch is closed.

20. The electronic device of claim 17, wherein, in a receive mode, the first switch is closed, the second switch is open.

21. The electronic device of claim 17, wherein the third switch is closed in a transmit mode, and the third switch is open in a receive mode.

22. The electronic device of claim 17, wherein the third switch is open in a transmit mode, and the third switch is closed in a receive mode.

23. The electronic device of claim 17, further comprising a controller coupled to the first and second switches and the third switch.

24. The electronic device of claim 17, further comprising an antenna coupled to the second terminal and a transceiver coupled to the first terminal.

25. The electronic device of claim 12, further comprising a transmit circuit or a receive circuit coupled to the first terminal, and an antenna coupled to the second terminal.

26. The electronic device of claim 13, further comprising a transmit circuit or a receive circuit coupled to the third terminal, and an antenna coupled to the second terminal.

* * * * *